United States Patent
Hara et al.

(10) Patent No.: US 8,749,247 B2
(45) Date of Patent: Jun. 10, 2014

(54) APPARATUS AND METHOD FOR DETECTING ABNORMALITY OF HIGH VOLTAGE CIRCUIT

(75) Inventors: Yuuichi Hara, Yokohama (JP); Noriko Hoshino, Kawasaki (JP); Tsuyoshi Morita, Zama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 203 days.

(21) Appl. No.: 13/391,718

(22) PCT Filed: Sep. 9, 2010

(86) PCT No.: PCT/JP2010/065527
§ 371 (c)(1),
(2), (4) Date: Feb. 22, 2012

(87) PCT Pub. No.: WO2011/037022
PCT Pub. Date: Mar. 31, 2011

(65) Prior Publication Data
US 2012/0146656 A1    Jun. 14, 2012

(30) Foreign Application Priority Data
Sep. 24, 2009    (JP) .................................. 2009-219037

(51) Int. Cl.
*G01R 31/14*    (2006.01)
(52) U.S. Cl.
USPC .......................................................... 324/509
(58) Field of Classification Search
USPC ........................................................ 324/509
See application file for complete search history.

(56) References Cited

U.S. PATENT DOCUMENTS

| | | | |
|---|---|---|---|
| 7,292,042 B2 * | 11/2007 | Morita et al. | 324/509 |
| 7,560,935 B2 * | 7/2009 | Morimoto | 324/525 |
| 8,004,285 B2 * | 8/2011 | Endou | 324/522 |
| 8,030,893 B2 | 10/2011 | Nakatsuji | |
| 8,310,242 B2 * | 11/2012 | Itten et al. | 324/509 |
| 2002/0121902 A1 * | 9/2002 | Suzuki | 324/509 |
| 2004/0130326 A1 | 7/2004 | Yamamoto | |

(Continued)

FOREIGN PATENT DOCUMENTS

| CN | 1447124 A | 10/2003 |
|---|---|---|
| CN | 101421883 A | 4/2009 |

(Continued)

OTHER PUBLICATIONS

Chinese Office Action, Nov. 20, 2013, 8 pages.

*Primary Examiner* — Arleen M Vazquez
*Assistant Examiner* — Feba Pothen
(74) *Attorney, Agent, or Firm* — Foley & Lardner LLP

(57) ABSTRACT

Disclosed are abnormality detecting apparatus and method for a high-voltage circuit (A), in which: a square wave pulse is outputted to a measuring point (p1) with a switch (SW1) set off, the switch (SW1) provided between an inverter circuit (2) and the ground, a difference voltage (Vp-p) between a voltage (Vh) detected at a phase of T/2 and a voltage (V1) detected at a phase of T is obtained, the occurrence of a ground fault is detected based on the size of the difference voltage (Vp-p); and the square wave pulse is outputted to the measuring point (p1) with the switch (SW1) set on, and it is judged that a loosening of a fastening section (p2) occurs when the difference voltage (Vp-p) exceeds a reference voltage (Vref2).

7 Claims, 3 Drawing Sheets

(56) References Cited

U.S. PATENT DOCUMENTS

| | | |
|---|---|---|
| 2007/0008666 A1 | 1/2007 | Morita et al. |
| 2008/0278174 A1 | 11/2008 | Li et al. |
| 2009/0051324 A1 | 2/2009 | Nakatsuji |

FOREIGN PATENT DOCUMENTS

| | | |
|---|---|---|
| CN | 201262636 Y | 6/2009 |
| JP | 2003-194871 A | 7/2003 |
| JP | 2003-250201 A | 9/2003 |
| JP | 2004-053367 A | 2/2004 |
| JP | 2004-361309 A | 12/2004 |
| JP | 2005-233822 A | 9/2005 |
| JP | 2006-170714 A | 6/2006 |
| JP | 2006-177840 A | 7/2006 |
| JP | 2009-053133 | 3/2009 |
| JP | 2010-181368 A | 8/2010 |

* cited by examiner

FIG. 3
|  | DIFFERENCE VOLTAGE | JUDGMENT |  |
|---|---|---|---|
| SW1 SET OFF (IN NORMAL CONDITION) | Vp-p ≥ Vref1 | OK |  |
|  | Vp-p < Vref1 | NG | GROUND FAULT |
| SW1 SET ON | Vp-p ≤ Vref2 | OK |  |
|  | Vp-p > Vref2 | NG | LOOSENING |
FIG. 4
WHEN SW1 IS OFF
(a) 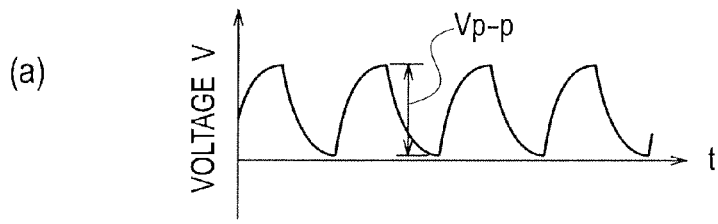
WHEN SW1 IS ON (WITH NO LOOSENING)
(b) 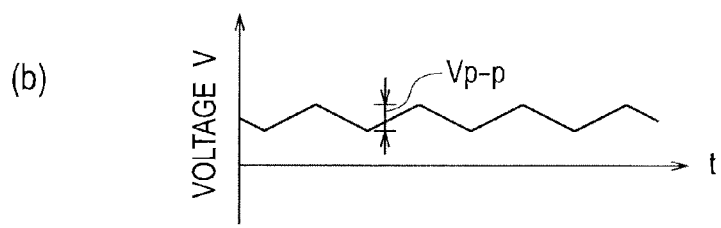
WHEN SW1 IS ON (WITH LOOSENING)
(c) 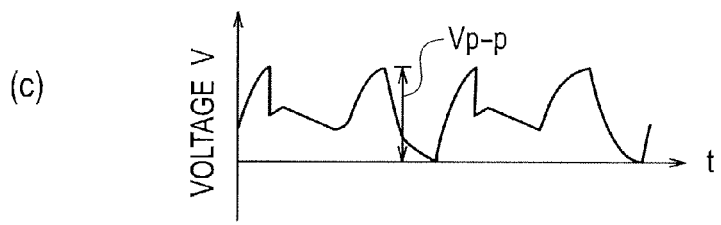

APPARATUS AND METHOD FOR DETECTING ABNORMALITY OF HIGH VOLTAGE CIRCUIT

TECHNICAL FIELD

The present invention relates to an abnormality detecting apparatus and an abnormality detecting method for detecting a ground fault of a high-voltage circuit installed in a vehicle and a loosening of a fastening section that mechanically fixes an electric wire or the like.

BACKGROUND ART

Japanese Patent Application Publication No. 2003-250201 discloses the following technique. A positive terminal of a high-voltage direct-current power source provided in an electric vehicle is connected to one end of a capacitor, a square wave signal is applied to a measuring point being the other end of the capacitor, a voltage signal occurring at the measuring point is detected, and thus a ground fault of the direct-current power source is detected.

SUMMARY OF INVENTION

Technical Problem

The technique described above is capable of detecting the ground fault of the direct-current power source, but has such a disadvantage that the loosening of a fastening section, which mechanically fixes an electric wire or the like connecting the direct-current power source and an inverter circuit to each other, cannot be detected when the loosening occurs.

The present invention has been made to solve the above problems, and an object of the present invention is to provide an abnormality detecting apparatus and an abnormality detecting method for a high-voltage circuit, both of which are capable of accurately detecting a ground fault and a loosening of a fastening section.

Solution to Problem

An aspect of the present invention is abnormality detecting apparatus and method for a high-voltage circuit which includes a direct-current power source and an inverter circuit connected to the direct-current power source via a fastening section, the abnormality detecting apparatus and method configured to detect a ground fault of the high-voltage circuit and a loosening of the fastening section. In the abnormality detecting apparatus and method for the high-voltage circuit, a first capacitor whose one end is connected to a positive terminal of the direct-current power source, and whose other end is designated as a measuring point, is provided; a square wave pulse signal is outputted to the measuring point; a first voltage occurring at the measuring point is measured at a time when a phase of the square wave pulse signal becomes a first phase; a second voltage occurring at the measuring point is measured at a time when the phase of the square wave pulse signal becomes a second phase different from the first phase; a difference voltage between the first voltage and the second voltage is obtained; a series connection circuit of a second capacitor and switch means is provided between a positive terminal of the inverter circuit and the ground; a ground fault of the direct-current power source is detected on the basis of the difference voltage which is measured with the switch means opened; and when no ground fault is detected, a loose state of the fastening section is detected on the basis of the difference voltage which is measured with the switch means closed.

BRIEF DESCRIPTION OF DRAWINGS

FIG. 3 is a judgment table of the abnormality detecting apparatus for the high-voltage circuit of the embodiment of the present invention, the judgment table showing a relationship among the size of a difference voltage Vp-p and a decrease in an insulation resistance and the occurrence of a loosening of a fastening section.

FIG. 4 is characteristic charts of the abnormality detecting apparatus for the high-voltage circuit of the embodiment of the present invention, the characteristic charts showing changes in the difference voltage Vp-p. Its part (a) shows a case where a SW1 is off and no abnormality occurs in the insulating resistance, its part (b) shows a case where the SW1 is on and no loosening occurs in the fastening section, and its part (c) shows a case where the SW1 is on and the loosening occurs in the fastening section.

DESCRIPTION OF EMBODIMENTS

An embodiment of the present invention is described below based on the drawings.

Figure 1:
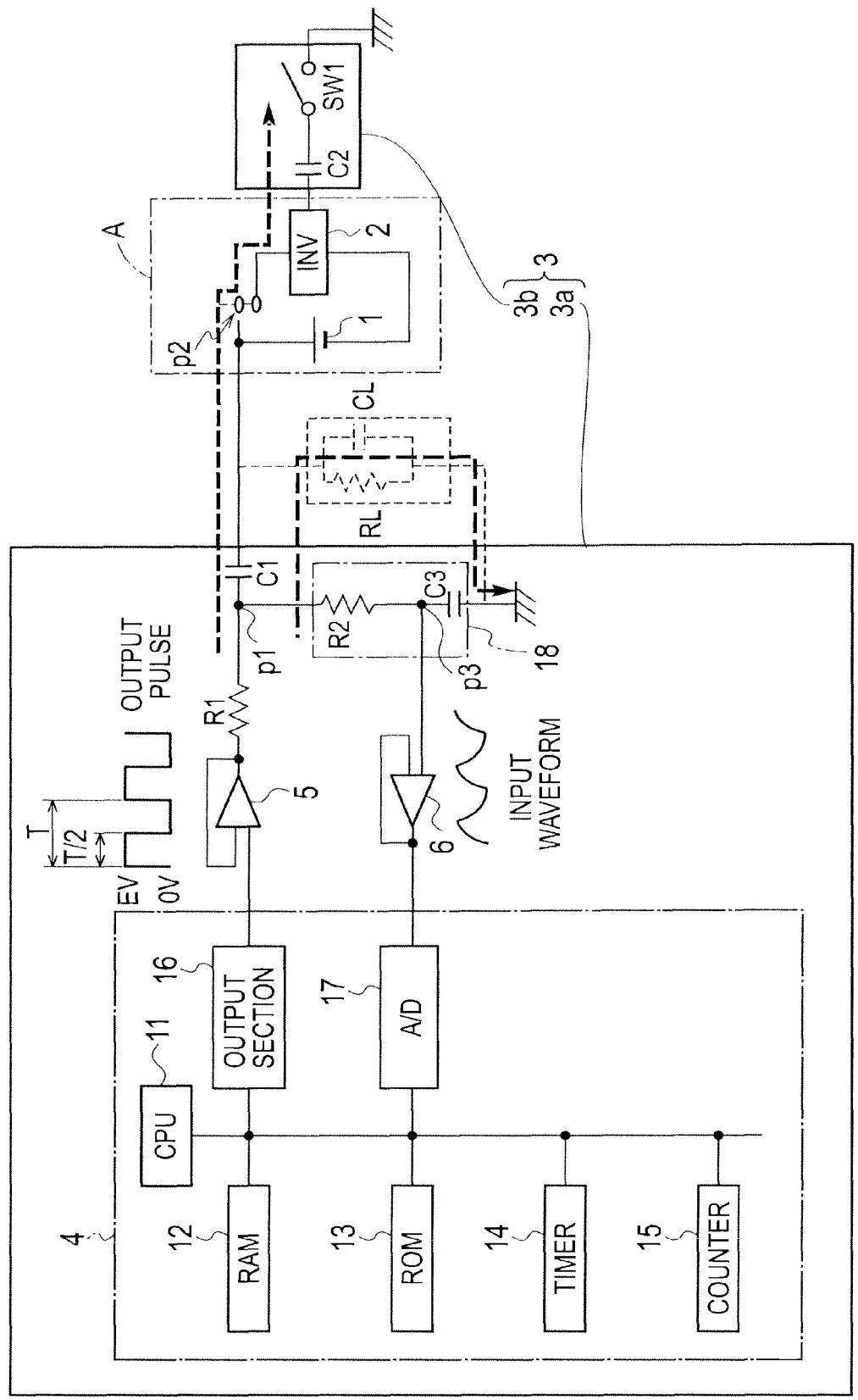
FIG. 1 is a block diagram showing a configuration of an abnormality detecting apparatus for a high-voltage circuit of an embodiment of the present invention.

As shown in FIG. 1, a high-voltage circuit A of the present invention includes a direct-current power source 1 and an inverter circuit 2. The high-voltage circuit A converts a direct-current power outputted from the direct-current power source 1 to an alternating-current power with the inverter circuit 2, and supplies the power to a drive motor (illustration omitted) and the like provided in an electric vehicle, a hybrid vehicle, or the like. A fastening section p2 for electrically connecting the direct-current power source 1 and the inverter circuit 2 to each other by mechanical fixing or fastening such an electric wire and a terminal is provided between a positive terminal of the direct-current power source 1 and a positive terminal of the inverter circuit 2.

An abnormality detecting apparatus 3 of the embodiment of the present invention is an apparatus configured to detect a ground fault of the high-voltage circuit A and a loosening of the fastening section p2, and includes: a first circuit part 3a connected to the positive terminal of the direct-current power source 1; and a second circuit part 3b connected to the positive terminal of the inverter circuit 2.

The first circuit part 3a includes a control circuit 4, a coupling capacitor C1 (a first capacitor), buffer amplifiers 5, 6, a resistor RE and a voltage measuring circuit 18.

One end of the coupling capacitor C1 is connected to the positive terminal of the direct-current power source 1 without the fastening section p2 interposed therebetween (connected to the positive terminal of the inverter circuit 2 via the fastening section p2), and the other end of the coupling capacitor C1 is grounded via the voltage measuring circuit 18. Hereinafter, the other end of the coupling capacitor C1 is referred to as a measuring point p1.

The voltage measuring circuit 18 includes a resistor R2 and a capacitor C3 which are connected to each other in series. One end of the resistor R2 is connected to the measuring point p1, and the other end of the resistor R2 is connected to the capacitor C3. One end of the capacitor C3 is connected to the resistor R2, and the other end of the capacitor C3 is grounded.

The control circuit 4 outputs a square wave pulse signal to the measuring point p1, and also measures the voltage occurring at the measuring point p1, thereby detecting whether a ground fault (a drop in insulation resistance) occurs in the high-voltage circuit A. The control circuit 4 is provided with: an output section (pulse output means) 16 which outputs the square wave pulse signal; an A/D converter 17 which performs A/D conversion on a voltage signal outputted by the voltage measuring circuit 18 (a voltage signal occurring at a connection point p3 between the resistor R2 and the capacitor C3); and a CPU 11, a RAM 12, a ROM 13, a timer 14, and a counter 15 which serve as a control center. The buffer amplifier 5 is provided on an output side of the output section 16, and the buffer amplifier 6 is provided on an input side of the A/D converter 17. An output terminal of the buffer amplifier 5 is connected to the measuring point p1 via the resistor R1.

The second circuit part 3b is a serial connection circuit including a capacitor C2 (a second capacitor) and a switch SW1 (switch means) which are connected to each other in series. The electrostatic capacitance of the capacitor C2 is set larger than that of the coupling capacitor C1.

One end of the capacitor C2 is connected to the positive terminal of the inverter circuit 2 without the fastening section p2 interposed therebetween (connected to the positive terminal of the direct-current power source 1 via the fastening section p2), and the other end of the capacitor C2 is connected to one end of the switch SW1. Moreover, one end of the switch SW1 is connected to the capacitor C2, and the other end of the switch SW1 is grounded. The switch SW1 performs ON/OFF operation under the control of the CPU 11.

In addition, as will be described later, the CPU 11 sets the frequency and duty cycle (50%, for example) of the square wave pulse signal to be outputted to the measuring point p1. The CPU 11 causes the square wave pulse signal with the set frequency and duty cycle to be outputted from the output section 16 with the switch S1 set off (opened), measures the voltage occurring at the measuring point p1 at this time, and thereby judges whether or not a ground fault occurs in the high-voltage circuit A. Furthermore, the CPU 11 causes the square wave pulse signal to be outputted from the output section 16 with the switch SW1 set on (closed), measures the voltage occurring at the measuring point p1 at this time, and thereby judges whether or not the loosening of the fastening section p2 occurs. In this respect, the loosening or the loose state of the fastening section means, for example, an act or a state in which a connecting condition deteriorates in a portion where two or more elements are electrically connected together by mechanical fixing or fastening means, such as the loosening of a bolt in a case where a wire, a terminal, and the like are fastened with the bolt.

Specifically, the CPU 11 has a function as a voltage measuring means for: measuring a first voltage occurring at measuring point p1 at a time when the phase of the square wave pulse signal outputted from the output section 16 becomes a first phase (for example, in a case where the duty cycle is set at 50%, at a time when the square wave pulse signal changes from a H level to a L level at an odd multiple of ½ of a cycle T (=T/2)); measuring a second voltage occurring at the measuring point p1 at a time when the phase of the square wave pulse signal becomes a second phase different from the first phase (for example, in a case where the duty cycle is set at 50%, at a time when the square wave pulse signal changes from the L level to the H level at an even multiple of T/2); and obtaining a difference voltage Vp-p between the first voltage and the second voltage. Moreover, the CPU 11 has a function as ground fault detector for detecting a ground fault of the direct-current power source 1 on the basis of the difference voltage Vp-p measured and calculated as described above with the switch SW1 set off (opened). Furthermore, the CPU 11 has a function as loose state detector for detecting the loosening of the fastening section p2 on the basis of the difference voltage Vp-p measured and calculated as described above with the switch SW1 set on (closed) when no ground fault of the direct-current power source 1 is detected.

Figure 2:
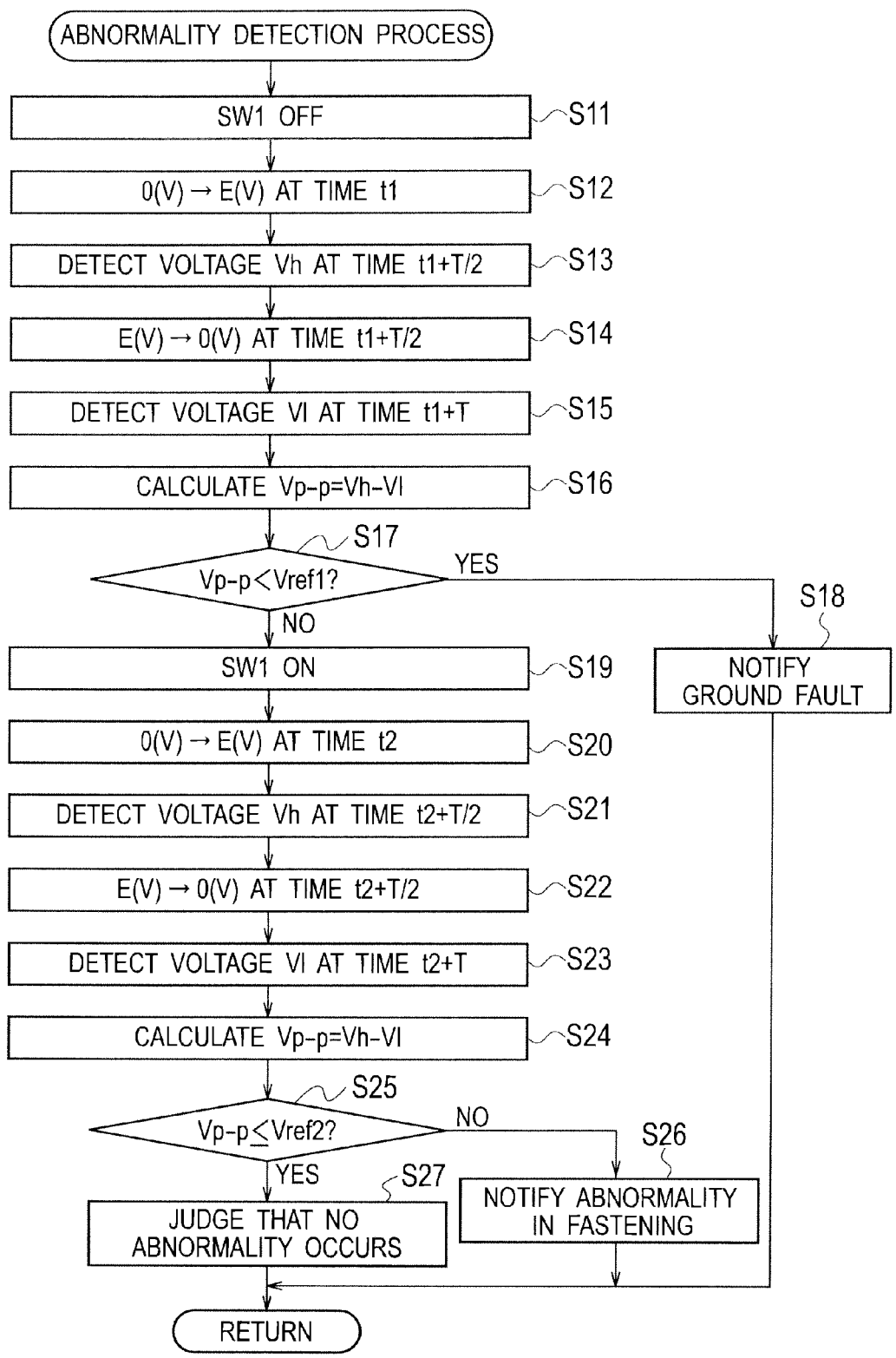
FIG. 2 is a flowchart showing a processing procedure of abnormality detection of the abnormality detecting apparatus for the high-voltage circuit of the embodiment of the present invention.

Next, an operation of the abnormality detecting apparatus of the embodiment configured as described above is described with reference to a flowchart shown in FIG. 2, a judgment table shown in FIG. 3, and characteristic charts shown in FIG. 4.

First, in step S11, the CPU 11 sets the switch SW1 off. Next, in step S12, the CPU 11 raises the voltage of the square wave pulse signal outputted from the output section 16 from 0 [V] to E [V]. The voltage of the square wave pulse signal is supplied to the measuring point p1, which is the other end of the coupling capacitor C1, via the buffer amplifier 5 and the resistor R1. Note that the square wave pulse signal outputted from the output section 16 is a signal which has a duty cycle of 50% and whose voltage changes between 0 to E [V].

In step S13, the CPU 11 detects a voltage Vh (a first voltage) occurring at the measuring point p1 at a time (first phase: time t1+T/2) when time T/2 elapses after the time (time t1) when the voltage of the square wave pulse signal is raised from 0 [V] to E [V]. The voltage occurring at the measuring point p1 is inputted into the A/D converter 17 via the resistor R2 and the buffer amplifier 6, and the CPU 11 detects the voltage Vh occurring at the measuring point p1 on the basis of voltage data inputted into the A/D converter 17.

Once time T/2 has elapsed after time t1, the CPU 11 reduces the voltage of the square wave pulse signal outputted from the output section 16 from E [V] to 0 [V] in step S14. Accordingly, the voltage supplied to the coupling capacitor C1 at this time is 0 [V].

In step S15, the CPU 11 detects a voltage V1 (a second voltage) occurring at the measuring point p1 at a time when time T elapses after time t1 (a second phase: time t1+T).

In step S16, the CPU 11 subtracts the voltage V1 detected in the process of step S15 from the voltage Vh detected in the process of step S13 to calculate the difference voltage Vp-p (=Vh−V1).

In step S17, the CPU 11 compares the difference voltage Vp-p obtained in the process of step S16 and a first reference voltage Vref1 set in advance. Then, if it is judged that the difference voltage Vp-p is lower than the first reference voltage Vref1 (Vp-p<Vref1) (YES in step S17), the CPU 11 judges that abnormality in insulation such as a ground fault occurs in the high-voltage circuit A, and notifies an operator of the occurrence of the ground fault in step S18.

Specifically, because, as shown by broken lines of FIG. 1, an insulation resistance RL and a vehicle electrostatic stray capacitance CL imaginarily exist between the positive terminal and a negative terminal (ground) of the direct-current power source 1 as shown by broken lines of FIG. 1, a current flowing through the insulation resistance RL increases and the voltage at the measuring point p1 decreases when the insulation resistance RL decreases. Then, The CPU 11 notifies the operator of the occurrence of the ground fault at a time when the difference voltage Vp-p falls below the first reference voltage Vref1.

In other words, as shown in the judgment table in FIG. 3, the CPU 11 judges that ground fault occurs if the difference voltage Vp-p is below the first reference voltage Vref1 while the switch SW1 is set off.

Meanwhile, as shown in part (a) of FIG. 4, if the difference voltage Vp-p is sufficiently large and the CPU 11 judges in step S17 that the difference voltage Vp-p is equal to or larger than the first reference voltage Vref1 (Vp-p≥Vref1) (NO in step S17), the CPU 11 judges that no abnormality in insulation such as a ground fault occurs in the high-voltage circuit A, and proceeds to a process of detecting the loosening of the fastening section p2.

In step S19, the CPU 11 sets the switch SW1 on. Specifically, the CPU 11 connects a high-voltage-side terminal of the inverter circuit 2 to the ground via the capacitor C2.

In step S20, the CPU 11 raises the voltage of the square wave pulse signal outputted from the output section 16 from 0 [V] to E [V]. The voltage of the square wave pulse signal is supplied to the measuring point p1, which is the other end of the coupling capacitor C1, via the buffer amplifier 5 and the resistor R1.

In step S21, the CPU 11 detects a voltage Vh (a first voltage) occurring at the measuring point p1 at a time (first phase: time t2+T/2) when time T/2 elapses after the time (time t2) when the voltage of the square wave pulse signal is raised from 0 [V] to E [V]. To put it specifically, the voltage occurring at the measuring point p1 is inputted into the A/D converter 17 via the resistor R2 and the buffer amplifier 6, and the CPU 11 detects the voltage Vh occurring at the measuring point p1 on the basis of the voltage data inputted into the A/D converter 17.

Thereafter, once time T/2 has elapsed after time t2, the CPU 11 reduces the voltage of the square wave pulse signal outputted from the output section 16 from E [V] to 0 [V] in step S22. Accordingly, the voltage supplied to the coupling capacitor C1 at this time is 0 [V].

In step S23, the CPU 11 detects a voltage V1 (a second voltage) occurring at the measuring point p1 at a time when time T elapses after time t2 (a second phase: time t2+T).

In step S24, the CPU 11 subtracts the voltage V1 detected in the process of step S23 from the voltage Vh detected in the process of step S21 to calculate a difference voltage Vp-p (=Vh−V1).

In step S25, the CPU 11 compares the difference voltage Vp-p obtained in the process of step S24 and a second reference voltage Vref2 set in advance. Then, if it is judged that the difference voltage Vp-p is lower than the second reference voltage Vref2 (Vp-p≥Vref2) (YES in step S25), the CPU 11 judges that no abnormality such as a loosening occurs in the fastening section p2, and notifies the operator that no loosening of the fastening section p2 occurs in step S27. In other words, if no loosening occurs in the fastening section p2, the voltage at the measuring point p1 is affected by the capacitor C2, and the difference voltage Vp-p is small. In this case, as shown in part (b) of FIG. 4, the difference between the voltage at the on-duty time and the voltage at the off-duty time is small, and the difference voltage Vp-p is equal to or smaller than the second reference voltage Vref2. Thus, it is possible to confirm that no loosening of the fastening section p2 occurs.

On the other hand, in step S25, if the CPU 11 judges that the difference voltage Vp-p exceeds the second reference voltage Vref2 (Vp-p>Vref2) (NO in step S25), the CPU 11 judges that a loosening occurs in the fastening section p2, and notifies the operator that an abnormality in fastening occurs in step S26. Specifically, if the loosening of the fastening section p2 occurs, an electrostatic capacitance occurs in the fastening section p2, and a combined electrostatic capacitance between the measuring point p1 and the ground decreases. Thus, the difference voltage Vp-p increases. In this case, as shown in part (c) of FIG. 4, the difference between the voltage at the on-duty time and the voltage at the off-duty time increases, and the difference voltage Vp-p exceeds the second reference voltage Vref2. Thus, it is possible to confirm the occurrence of the loosening of the fastening section p2. In other words, as shown in the judgment table in FIG. 3, if the difference voltage Vp-p exceeds the second reference voltage Vref2 while the switch SW1 is set ON, the CPU 11 judges that the loosening of the fastening section p2 occurs, and notifies the operator of the loosening.

As described above, in the abnormality detecting apparatus for the high-voltage circuit A of the embodiment, the series connection circuit in which the capacitor C2 and the switch SW1 are connected together in series is provided between the inverter circuit 2 and the ground. The abnormality detecting apparatus judges whether a ground fault occurs in the high voltage circuit A by outputting the square wave pulse signal to the measuring point p1 with the switch SW1 set off. Furthermore, under the condition that no ground fault occurs, the abnormality detecting apparatus sets the switch SW1 on, and judges that the loosening of the fastening section p2 occurs if the difference voltage Vp-p exceeds the second reference voltage Vref2 when outputting the square wave pulse signal to the measuring point p1 in this state. Accordingly, the abnormality detecting apparatus is capable of detecting the occurrence of the loosening of the fastening section p2 surely and quickly. Thus, this makes it possible to recognize the loosening at a time before the fastening section p2 is completely unfastened (disconnected), and to thereby provide maintenance work and the like in advance.

Moreover, the electrostatic capacitance of the capacitor C2 is set larger than that of the coupling capacitor C1. Thus, the change in the difference voltage Vp-p can be made larger when the loosening of the fastening section p2 occurs. Hence, the accuracy of detecting the loosening of the fastening section p2 can be improved.

Furthermore, the duty cycle of the square wave pulse outputted to the measuring point p1 is set at 50%, and the difference voltage Vp-p is obtained based on the voltage Vh at the time when the square wave pulse changes from the H level to the L level and the voltage V1 at the time when the square wave pulse changes from the L level to the H level. Thus, it is possible to accurately obtain the difference between the voltage at the on-duty time of and the voltage at the off-duty time, and to thereby improve the accuracy in the detection of the ground fault and in the detection of the loosening of the fastening section.

As described above, the abnormality detecting apparatus and method for the high-voltage circuit A of the present invention output the square wave pulse signal to the measuring point with the switch means opened (set off), and acquires the difference voltage Vp-p between the first voltage detected at the time when the phase of the square wave pulse signal becomes the first phase and the second voltage detected at the time when the phase of the square wave pulse signal becomes the second phase. Then, the abnormality detecting apparatus and method detect whether or not a ground fault occurs in the high-voltage circuit A, on the basis of the size of the difference voltage Vp-p. Furthermore, when no ground fault is detected, the abnormality detecting apparatus and method close (set on) the switch means, and output the square wave pulse signal to the measuring point, as well as acquires the difference voltage Vp-p between the first voltage detected at the time when the phase of the square wave pulse signal becomes the first phase and the second voltage detected at the time when the phase of the square wave pulse signal becomes the second phase. Then, the abnormality detecting apparatus and method detect whether or not a loosening occurs in the fastening section, on the basis of the size of the difference voltage Vp-p. Accordingly, when the loosening occurs in the fastening section connecting the direct-current power source and the inverter circuit, the abnormality detecting apparatus and method are capable of detecting this loosening surely and quickly.

The abnormality detecting apparatus and method for the high-voltage circuit of the present invention have been described above based on the illustrated embodiment. However, the present invention is not limited to this embodiment. The configuration of each of the parts can be replaced with any configuration having the similar function.

The present application claims the priority based on Japanese Patent Application No. 2009-219037 filed on Sep. 24, 2009. The entire content of this application is incorporated in the description by reference.

Industrial Applicability

The present invention can be used to quickly recognize the occurrence of the loosening of the fastening section connecting the high-voltage direct-current power source and the inverter circuit when the loosening occurs.

Reference Signs List
  1 DIRECT-CURRENT POWER SOURCE
  2 INVERTER CIRCUIT
  3 ABNORMALITY DETECTING APPARATUS
  4 CONTROL CIRCUIT
  5,6 BUFFER AMPLIFIER
  SW1 SWITCH
  C1 COUPLING CAPACITOR (FIRST CAPACITOR)
  C2 CAPACITOR (SECOND CAPACITOR)
  C3 CAPACITOR
  11 CPU
  12 RAM
  13 ROM
  14 TIMER
  15 COUNTER
  16 OUTPUT SECTION (PULSE OUTPUT MEANS)
  17 A/D CONVERTER
  18 VOLTAGE MEASURING CIRCUIT
  RL INSULATION RESISTANCE
  CL VEHICLE ELECTROSTATIC STRAY CAPACITANCE
  p1 MEASURING POINT
  p2 FASTENING SECTION

The invention claimed is:

1. An abnormality detecting apparatus for a high-voltage circuit which includes a direct-current power source and an inverter circuit connected to the direct-current power source via a fastening section, the abnormality detecting apparatus configured to detect a ground fault of the high-voltage circuit and a loosening of the fastening section, the abnormality detecting apparatus comprising:
  a first capacitor whose one end is connected to a positive terminal of the direct-current power source, and whose other end is designated as a measuring point;
  a pulse output section configured to output a square wave pulse signal to the measuring point;
  a series connection circuit of a second capacitor and a switch, provided between a positive terminal of the inverter circuit and the ground;
  a voltage measuring section configured to measure a first voltage occurring at the measuring point at a time when a phase of the square wave pulse signal outputted from the pulse output section becomes a first phase, and a second voltage occurring at the measuring point at a time when the phase of the square wave pulse signal becomes a second phase different from the first phase, and to obtain a difference voltage between the first voltage and the second voltage;
  a ground fault detector configured to detect a ground fault of the direct-current power source on the basis of the difference voltage measured by the voltage measuring section with the switch opened; and
  a loose state detector configured to detect a loose state of the fastening section on the basis of the difference voltage measured by the voltage measuring section with the switch closed when no ground fault is detected by the ground fault detector.

2. The abnormality detecting apparatus for the high-voltage circuit according to claim 1, wherein
  the square wave pulse has a duty cycle of 50%,
  the first phase is a time when the square wave pulse changes from a H level to a L level, and
  the second phase is a time when the square wave pulse changes from the L level to the H level.

3. The abnormality detecting apparatus for the high-voltage circuit according to claim 1, wherein the ground fault detector compares the difference voltage and a first reference voltage set in advance, and judges that the ground fault occurs when the difference voltage is lower than the first reference voltage.

4. The abnormality detecting apparatus for the high-voltage circuit according to claim 1, wherein the loose state detector compares the difference voltage and a second reference voltage set in advance, and judges that the loosening occurs in the fastening section when the difference voltage is higher than the second reference voltage.

5. The abnormality detecting apparatus for the high-voltage circuit according to claim 1, wherein an electrostatic capacitance of the second capacitor is larger than that of the first capacitor.

6. An abnormality detecting method for a high-voltage circuit including a direct-current power source and an inverter circuit connected to the direct-current power source via a fastening section, the abnormality detecting method being for detecting a ground fault of the high-voltage circuit and a loosening of the fastening section, the abnormality detecting method comprising:
  providing a first capacitor whose one end is connected to a positive terminal of the direct-current power source, and whose other end is designated as a measuring point;
  outputting a square wave pulse signal to the measuring point;
  measuring a first voltage occurring at the measuring point at a time when a phase of the square wave pulse signal becomes a first phase;
  measuring a second voltage occurring at the measuring point at a time when the phase of the square wave pulse signal becomes a second phase different from the first phase;
  obtaining a difference voltage between the first voltage and the second voltage;
  providing a series connection circuit of a second capacitor and a switch between a positive terminal of the inverter circuit and the ground;
  detecting a ground fault of the direct-current power source on the basis of the difference voltage which is obtained with the switch opened; and
  when no ground fault is detected, detecting a loose state of the fastening section on the basis of the difference voltage which is obtained with the switch closed.

7. An abnormality detecting apparatus for a high-voltage circuit which includes a direct-current power source and an inverter circuit connected to the direct-current power source via a fastening section, the abnormality detecting apparatus configured to detect a ground fault of the high-voltage circuit and a loosening of the fastening section, the abnormality detecting apparatus comprising:
- a first capacitor whose one end is connected to a positive terminal of the direct-current power source, and whose other end is designated as a measuring point;
- pulse output means configured to output a square wave pulse signal to the measuring point;
- a series connection circuit of a second capacitor and switch means, provided between a positive terminal of the inverter circuit and the ground;
- voltage measuring means configured to measure a first voltage occurring at the measuring point at a time when a phase of the square wave pulse signal outputted from the pulse output means becomes a first phase, and a second voltage occurring at the measuring point at a time when the phase of the square wave pulse signal becomes a second phase different from the first phase, and to obtain a difference voltage between the first voltage and the second voltage;
- a ground fault detector configured to detect a ground fault of the direct-current power source on the basis of the difference voltage measured by the voltage measuring means with the switch means opened; and
- a loose state detector configured to detect a loose state of the fastening section on the basis of the difference voltage measured by the voltage measuring means with the switch means closed when no ground fault is detected by the ground fault detector.

* * * * *